United States Patent [19]
Mlcak et al.

[11] Patent Number: 5,464,509
[45] Date of Patent: Nov. 7, 1995

[54] P-N JUNCTION ETCH-STOP TECHNIQUE FOR ELECTROCHEMICAL ETCHING OF SEMICONDUCTORS

[75] Inventors: Richard Mlcak, Somerville; Harry L. Tuller, Wellesley, both of Mass.

[73] Assignee: Massachusetts Institute of Technology, Cambridge, Mass.

[21] Appl. No.: 246,762

[22] Filed: May 20, 1994

[51] Int. Cl.$^6$ .................. C25F 3/12; C25F 3/14
[52] U.S. Cl. .................. 204/129.3; 204/129.55; 204/129.7; 204/129.75
[58] Field of Search .................. 204/129.3, 129.7, 204/129.75, 129.65, 129.55

[56] References Cited

U.S. PATENT DOCUMENTS

| | | | |
|---|---|---|---|
| 3,616,348 | 10/1971 | Grieg | 204/129.3 X |
| 4,303,482 | 12/1981 | Buhne et al. | 204/129.3 |
| 4,414,066 | 11/1983 | Forrest et al. | 204/129.3 |
| 4,482,443 | 11/1984 | Bacon et al. | 204/129.3 |
| 4,543,171 | 9/1985 | Firester et al. | 204/129.3 |
| 4,664,762 | 5/1987 | Hirata | 204/129.3 |
| 4,880,493 | 11/1989 | Ashby et al. | 156/628 |
| 4,995,953 | 2/1991 | Yee | 204/129.3 |
| 4,995,954 | 2/1991 | Guilinger et al. | 204/129.75 |
| 5,021,364 | 6/1991 | Akamine et al. | 437/228 |
| 5,129,982 | 7/1992 | Wang et al. | 156/628 |
| 5,129,991 | 7/1992 | Gilton | 156/635 |
| 5,149,404 | 9/1992 | Blonder et al. | 204/129.1 |
| 5,167,778 | 12/1992 | Kaneko et al. | 204/129.3 |

FOREIGN PATENT DOCUMENTS

| | | |
|---|---|---|
| 61-105953 | 5/1986 | Japan . |
| 63-225599 | 9/1988 | Japan . |
| 63-267391 | 10/1988 | Japan . |

OTHER PUBLICATIONS

Kloeck, Ben et al., "Study of Electrochemical Etch–Stop for High–Precision Thickness Control of Silicon Membranes," IEEE Trans. Electron Dev. 36(4):663–669 (1989, Apr.).

Levy–Clement, Claude, "Photoelectrochemical Etching of Silicon Electrochimica Acta", 37(5):877–888 (1992) no month found.

Yoshida, Takashi, "Photo–Induced Preferential Anodization for Fabrication of Monocrystalline Micromechanical Structures," Proceedings of the IEEE Workshop Microelectro Mechanical Systems, Travemunde, Germany, pp. 56–60 (1992, Feb. 4).

Eijkel, C. J. M., et al., "A New Technology for Micromachining of Silicon: Dopant Selective HP Anodic Etching for the Realization of Low–Dopant Monocrystalline Silicon Structures," IEEE Electron Device Letters, 11(12):588–589 no month (1990).

Branebjerg, J., et al., "Dopant Selective HF Anodic Etching of Silicon for the Realization of Low–Doped Monocrystalline Silicon Microstructures," Proceeding of the IEEE Workshop Microelectro Mechanical Systems, An Investigation of MicroStructures, Sensors, Actuators, Machines and Robots, Nara, Japan, Jan. 30, pp. 221–226 no month (1991).

Meek, R. L., and Schumaker, N. E., "Anodic Dissolution and Selective Etching of Gallium Phosphide," J. Electrochem. Soc., pp. 1148–1152 (1972, Sep.).

(List continued on next page.)

*Primary Examiner*—Donald R. Valentine
*Attorney, Agent, or Firm*—Hamilton, Brook, Smith & Reynolds

[57] ABSTRACT

A method of electrochemical machining of micromechanical structures from a silicon substrate having both p and n-type regions in hydrofluoric electrolyte solution is disclosed. Only the p-type region of the silicon substrate may be selectively etched by providing means for inhibiting the injection of holes from the p-type region through the n-type region. Inhibiting the injection of holes includes forming a p-type layer over the n-type region, forming a layer of material inert to the electrochemical etchant over the n-type region, imposing a reverse electrical bias between the p-type region and n-type region, and providing recombination centers in the n-type region to induce recombination of holes injected into the n-type region.

33 Claims, 8 Drawing Sheets

OTHER PUBLICATIONS

Benjamin, J. D., "Micromachining of Silicon by Selective Anodisation," pp. 23–43 no month (1986).

Lee, K. C., "The Fabrication of Thin, Freestanding, Single–Crystal, Semiconductor Membranes," J. Electrochem. Soc., 137(8): 2556–2574, (1990, Aug.).

Meek, R. L. "Electrochemically Thinned N/N Epitaxial Silicon–Method and Applications," J. Electrochem. Soc., 118(7):1240–1246 (1971, Jul.).

Nuese, C. J. and Gannon, J. J., "Electrolytic Removal of P–Type GaAs Substrates from Thin, N–Type Semiconductor Layers," J. Electrochem. Soc., 117(8), (1970, Aug.).

Meek, R. L. et al., "Preparation of Supported, Large–Area, Uniformly Thin Silicon Films for Particle–Channeling Studies," Nuclear Instruments and Methods, 94:435–442, no month (1971).

Khare, R., et al., "Effect of Band Structure on Etch–Stop Layers in the Photoelectrochemical Etching of GaAs/AlGaAs Semiconductor Structures," Appl. Phys. Lett., 62(15):1809–1811 (1993, Apr.).

Lee, Kevin C., et al., "A New Self–Limiting Process for the Production of Thin Submicron Semiconductor Films," J. Appl. Phys. 54(7):4035–4037 (1983, Jul.).

Lee, Kevin C., et al., "A New Method for the Fabrication of Submicron Thick Gallium Arsenide Membranes," Appl. Phys. Lett., 43(5):488–489 (1983, Sep.).

P-N JUNCTION ETCH-STOP TECHNIQUE FOR ELECTROCHEMICAL ETCHING OF SEMICONDUCTORS

BACKGROUND

Many devices fabricated from silicon and other semiconductors can not be constructed from two dimensional structures, but must be truly three-dimensional. Some examples of these three-dimensional devices include micromechanical sensors and actuators, electrostatically driven micro-motors, intricate micro-tubing and valve systems. Other three-dimensional structures are optical gratings and lenses, isolation trenches, mesas and via holes.

Three-dimensional structures formed from silicon substrates having p and n-type silicon regions are generally achieved by lithography and anisotropic etching processes. The structures which can be made by these processes are geometrically limited due to the finite number of <111> surfaces and the availability of wafers with different orientations. Additionally, in order to achieve the necessary etch stops in which etching of a desired silicon substrate terminates, the silicon substrate is generally highly doped. This causes mechanical stresses in the material which can warp the resulting structure leading to degradation of the micromechanical response of the device.

Accordingly, there is a need of an improved method for micromachining three-dimensional structures from substrates having both n and p-type silicon regions in which n-type and p-type silicon regions can be selectively etched without warping the resulting structure.

SUMMARY OF THE INVENTION

Referring to FIG. 1, it is known in the field of electrochemical etching that bulk p-type silicon subjected to an electrolyte such as hydrofluoric electrolyte and an anodic electric potential can be electrochemically etched in a dark environment. Additionally, it can be seen that bulk n-type silicon subjected to the same conditions will etch very little. It is also known that selective etching of the p-type region of a gallium phosphide (GAP) structure having p-type and n-type regions is possible. Therefore, it would appear that if a silicon wafer having both n-type and p-type regions is formed and electrochemically etched, that only the p-type regions will experience etching. If this were possible, complex silicon structures could be electrochemically etched by forming patterned regions of n-type silicon on a p-type silicon substrate and etching only the p-type region. However, attempts to etch such a silicon wafer have not been successful. When such a silicon wafer is prepared and subjected to electrochemical etching, both the n-type and p-type regions etch.

An explanation of why both the n-type and p-type regions etch is illustrated in FIG. 2. FIG. 2, shows a silicon wafer having an n-type region 18 formed over a p-type substrate or region 16. By applying an anodic potential to the p-type substrate with respect to the HF electrolyte, the p-n junction 32 becomes forward biased and holes are injected from the p-type substrate into the n-type region 16. These holes, which have long minority carrier lifetimes in indirect band-gap semiconductors such as silicon, have ample time to diffuse or to be swept by internal fields to the n-type region electrolyte interface causing n-type region dissolution. Furthermore, any defects 54 such as stacking faults, grain boundaries or dislocations act as hole generation centers which increase the number of holes "h" injected to the n-type region electrolyte interface in the area of the defect 54 when subjected to electrochemical etching. This causes enhanced localized etching in the region surrounding each defect 54 which eventually forms an etched-through hole 56 at the location of the defect 54. Once a hole 56 has been made through the n-type region 18, the etchant comes into contact with the p-type region 16 and electrochemical etching of the p-type region 16 under the n-type region 18 begins. As a further consequence, more of the anodic potential applied between the p-type substrate and HF electrolyte falls across the p-n junction 32, increasing its forward bias and dramatically increasing the hole injection rate. Therefore, etching of both the n-type region 18 and p-type region 16 occurs. Since there are typically many defects 54 within n-type region 18, the n-type region 18 etches away rather quickly.

The present invention provides a solution for preventing the electrochemical etching of the n-type region on an n-over-p silicon wafer. This enables structures to be electrochemically etched from silicon wafers having both n-type and p-type regions. The present invention provides an electrochemical etching process which includes forming an n-type region on a p-type indirect band gap semiconductor substrate. At least portions of the n-type region are provided with means for inhibiting the injection of holes from the p-type substrate through said portions of the n-type region. The n-type region and the p-type substrate are exposed to an electrochemical etchant with an electrical bias supplied between the p-type substrate and electrochemical etchant such that the p-type substrate is selectively etched with substantially no etching of the said portions of the n-type region.

Inhibiting the injection of holes can be accomplished by providing recombination centers within said portions of the n-type region. The recombination centers induce recombination of the holes injected into said portions of the n-type region by reducing the minority carrier lifetime, that is the diffusion length of holes through the n-type region is reduced to less than the thickness of the n-type region. This can be accomplished by providing said portions of the n-type region with impurities, creating crystal defects within said portions of the n-type region such as by damaging said portions of the n-type region, or by forming said portions of the n-type region from amorphous silicon.

Another method for inhibiting the injection of holes includes forming a p-type layer over the n-type region. Still another method includes forming a layer of material over the n-type region which is inert to the electrochemical etchant. Furthermore, the injection of holes can be inhibited by imposing a p-n junction reverse electrical bias between the p-type and n-type regions.

The present invention allows three-dimensional structures to be micromachined with high aspect ratios, and with minimal mechanical stresses because the silicon regions may be lightly doped.

BRIEF DESCRIPTION OF THE DRAWINGS

The foregoing and other objects, features and advantages of the invention will be apparent from the following more particular description of preferred embodiments of the drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT

Figure 1:
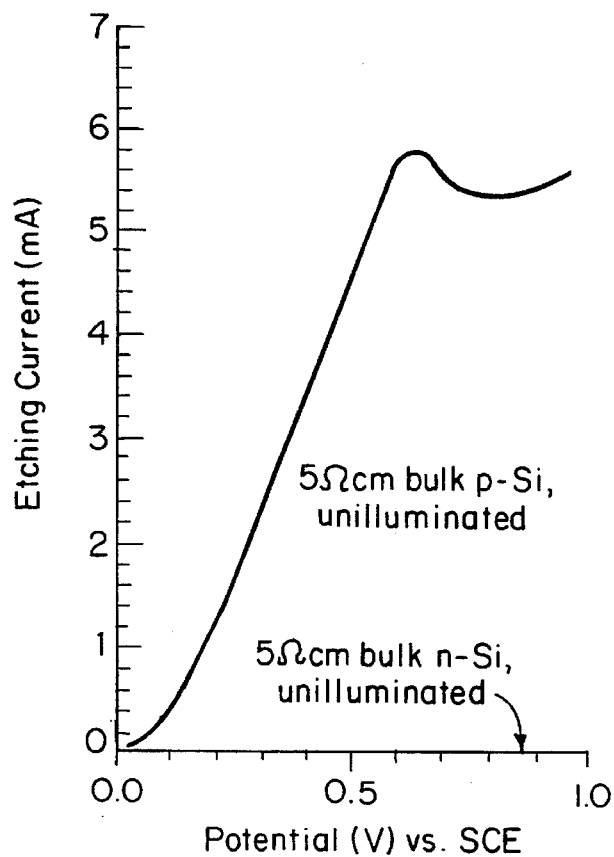
FIG. 1 is a graph of the electrochemical cell current and voltage characteristics for bulk p-type silicon and bulk n-type silicon.
Figure 2:
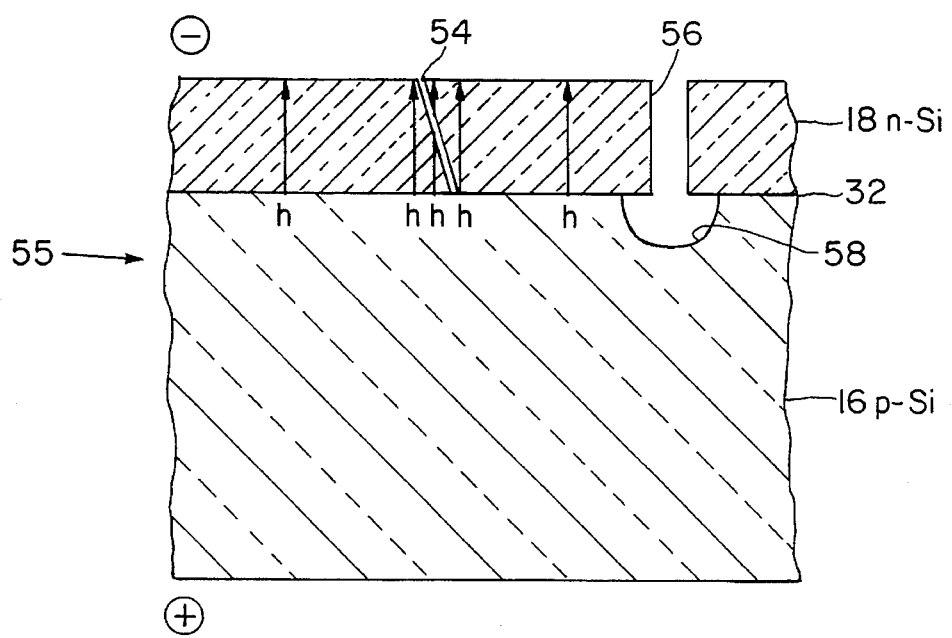
FIG. 2 is a cross-sectional view of a portion of a prior art silicon wafer having a p-type region and a n-type region being electrochemically etched.
Figure 3:
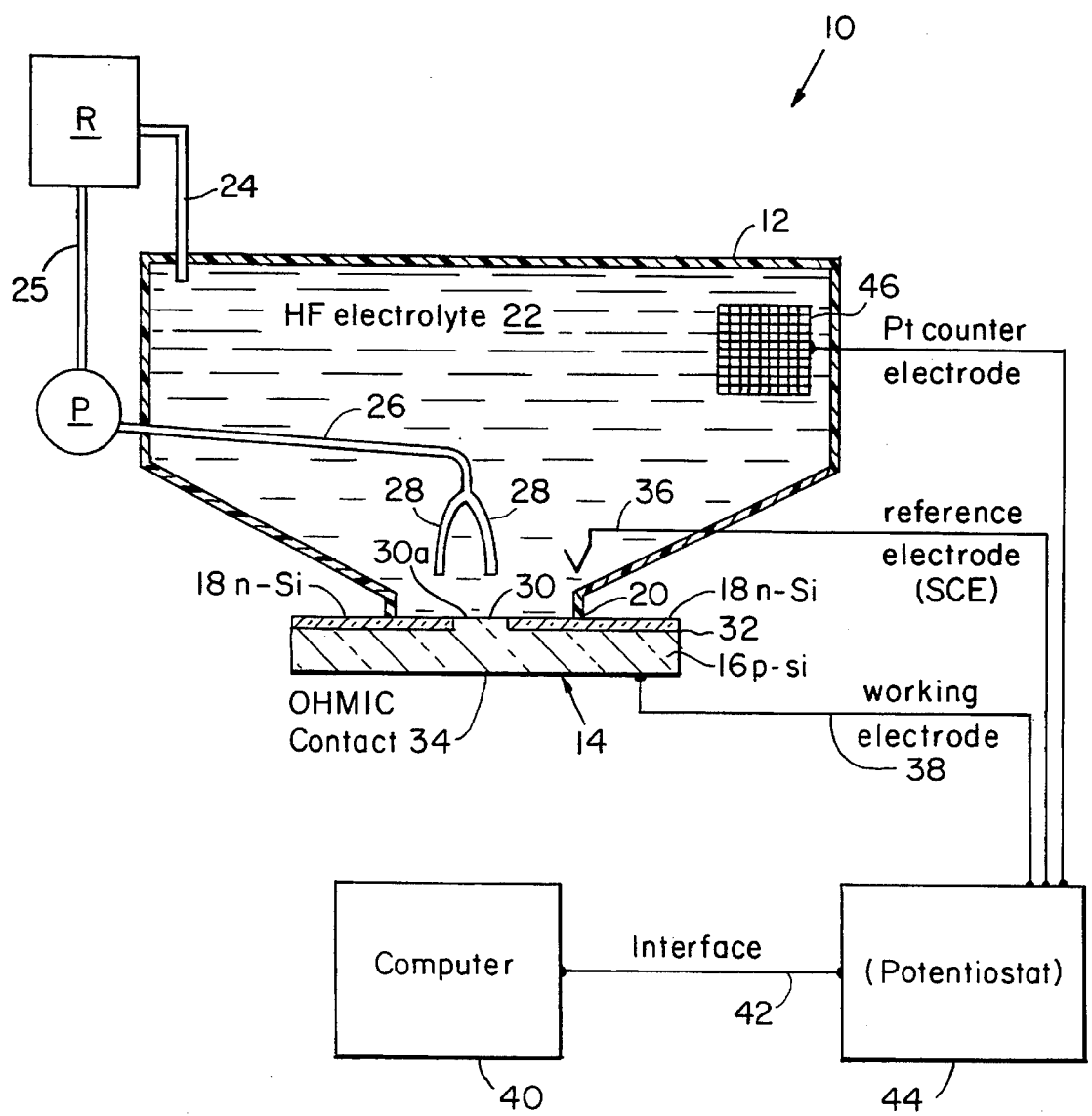
FIG. 3 is a top schematic view of a preferred electrochemical machining cell.

The electrochemical machining of p-type regions of a silicon wafer having both p and n-type regions is conducted by electrochemical etching apparatus 10 depicted in FIG. 3. Apparatus 10 includes a Teflon® cell 12 containing a 5% weight aqueous hydrofluoric acid electrolyte solution 22. Alternatively, other aqueous hydrofluoric acid concentrations or alcohol based (ethanol, methanol, etc.) hydrofluoric acid solutions or other fluoride ion electrolytes such as $NH_4HF_2$, $NH_4F$ etc. may be used. The silicon wafer 14 which is to be etched, is pressed against Teflon® seal 20 exposing surface 30 to HF electrolyte 22. Silicon wafer 14 is a n-on-p structure with a layer or region of n-type silicon 18 having recombination centers over a region of p-type silicon 16 separated by a p-n junction 32. A circulating pump "P" circulates HF electrolyte 22 between cell 12 and reservoir "R" by pumping HF electrolyte 22 through intake pipe 24 into reservoir "R" and returning HF electrolyte 22 to cell 12 via return pipes 25 and 26. Two tubes 28 are connected to pipe 26 and direct the returning HF electrolyte 22 onto surface 30 of wafer 14. The circulating HF electrolyte 22 removes bubbles evolving on surface 30 during etching. In one example, reservoir "R" has a volume of 1 liter and pump "P" is a variable controlled pump with a flow integrator. Additionally, the HF electrolyte 22 is a 5% HF solution at room temperature. Furthermore, the inner diameter of tubes 28 is ⅛ inch. Alternatively, the volume of reservoir "R", the concentration of HF electrolyte 22 and the inner diameter of tubes 28 can be varied. In addition, pump "P" can have a fixed flow rate.

Potentiostat 44 provides a variable voltage or bias across the HF electrolyte 22 and wafer 14 interface 30a and monitors the etching current. Platinum counter electrode 46 is immersed in HF electrolyte 22 and electrically connects potentiostat 44 to HF electrolyte 22 to monitor and supply etching current. Working electrode 38 is electrically connected to ohmic contact 34 on the p-type region 16 of wafer 14 and electrically connects wafer 14 to potentiostat 48 thereby completing an electrical circuit through wafer 14, HF electrolyte 22, counter electrode 46 and potentiostat 44. Standard Calomel Electrode (SCE) reference electrode 36 is immersed in electrolyte 22 near surface 30. Electrode 36 provides a reference from which the potential drop or bias across the wafer 14 and electrolyte 22 interface 30a can be measured. In the preferred embodiment, electrode 46 is a 15 $cm^2$ platinum mesh counter electrode. Additionally, contact 34 is preferably formed on the backside of wafer 14 by a $n^+$ phosphorous in-diffusion followed by a 0.1 μm titanium-tungsten alloy and 0.2 μm gold depositions.

The voltage and current between HF electrolyte 22 and wafer 14 is provided by potentiostat 44 and is controlled by computer 40 through interface 42. Additionally, computer 40 and potentiostat 44 can be omitted with voltage and current between HF electrolyte 22 and wafer 14 provided by a battery.

The etching process in the HF electrolyte solution 22 is controlled by the bias across the electrolyte 22 and wafer interface 30a. The etching is conducted without the aid of illumination. The application of a sufficient positive bias from electrode 38 to electrode 46 across HF electrolyte 22 and wafer 14 will drive reduction/oxidation reactions at electrode 46 and wafer 14 in which holes are driven to the surface 30 of p-type region 16 of wafer 14. The holes de-stabilize the surface silicon atoms on the exposed p-type region 16 of wafer 14 and participate in an oxidation reaction that consumes silicon of p-type region 16. The reaction products are then dissolved by HF electrolyte 22. As discussed below, n-type region 18 is provided with recombination centers which are typically point defects such as interstitials or vacancies, or impurities introduced into n-type region 18. Any holes driven into n-type region 18 are recombined at the recombination centers within n-type region 18 before reaching interface 30a. As a result, no etching of n-type region 18 occurs. In this manner, the p-type region 16 etches while the n-type region 18 does not etch or only etches a negligible amount. To optimize the selectively, conditions are used to minimize the etching of n-type silicon 18. This is done by using doping densities of the n-type region below $10^{17}$ $cm^{-3}$ as well as lower concentrations of HF electrolyte.

Figure 4A:
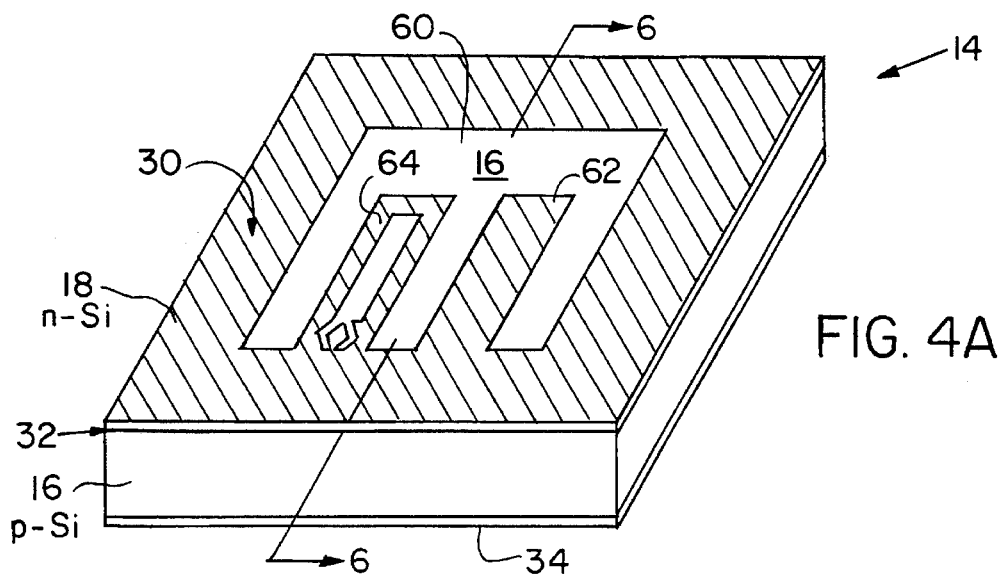
FIG. 4A is a perspective view of a preferred silicon wafer prepared for electrochemical etching in accordance with the present invention.
Figure 4B:
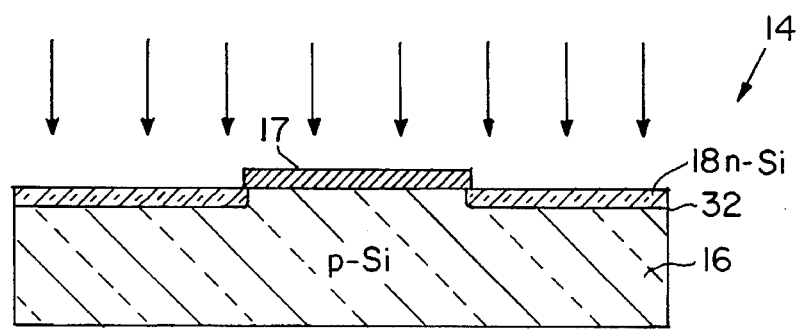
FIGS. 4B and 4C depict a preferred process for forming a preferred silicon wafer.

Referring to FIG. 4A, wafer 14 is prepared by forming an n-type layer or region 181 of silicon in a pattern 60 over a p-type silicon substrate or region 16 with the help of a mask 17 (FIG. 4B). The pattern 60 can be for any suitable structure but for purposes of illustration, pattern 60 has two cantilever beams 62 and 64. The n-type region 18 can be formed by any conventional method such as by in-diffusion or implantation of phosphorous into the p-type substrate or region 16 or by epitaxial growth over p-type region 16. If the n-type region 18 is formed by epitaxial growth, the n-type region 18 must then be patterned to provide the desired pattern 60.

Figure 4C:
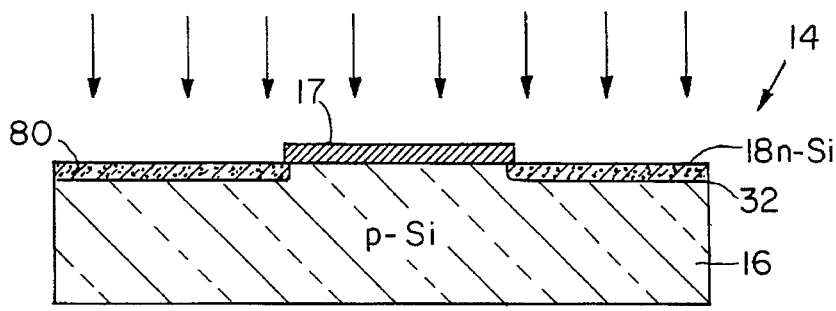

N-type region 18 is an indirect band gap semiconductor. The hole diffusion length of n-type region 18 is of the order of or greater than the thickness of n-type region 18. In one embodiment, once the n-type region 18 is formed, it is necessary for n-type region 18 to have recombination centers 80 for recombining holes injected into the n-type region 18 from the p-type region 16 so that the hole diffusion length of n-type region 18 is less than its thickness to prevent injection of holes through the n-type region 18 which would cause etching. The recombination centers 80 can be provided by masking n-type region 18 and damaging the exposed portions of n-type region 18 through implantation (FIG. 4C) or by introducing transition metal impurities such as gold or copper into the exposed portions of n-type region 18 through in-diffusion or implantation. Additionally, an n-type region 18 having a sufficient concentration of recombination centers 80 can be created by forming an amorphous layer of silicon on top of the p-type region 16 or by implanting phosphorous into the p-type substrate 16 using an appropriate time and temperature to both form an n-type region and leave sufficient damage to provide recombination centers 80. Although several particular methods have been described for forming n-type regions having recombination centers over a p-type substrate, other processes or any combination of the processes described above can be used.

Figure 5:
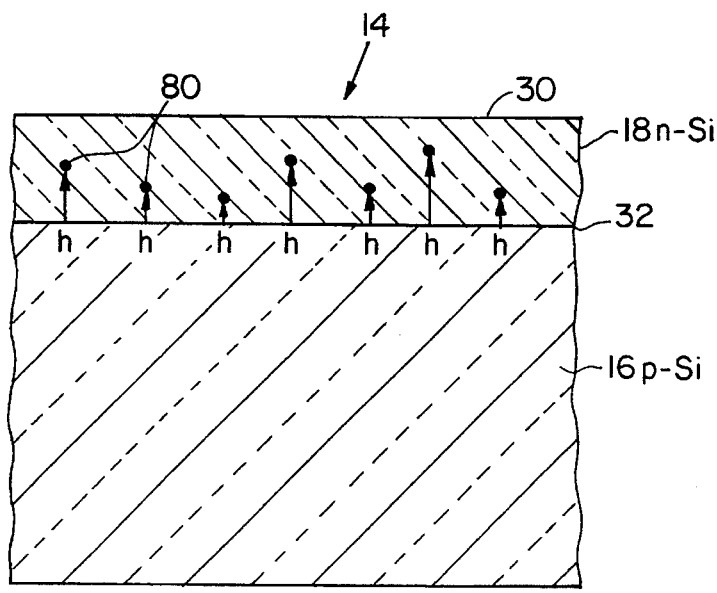
FIG. 5 is a cross-sectional view of a portion of a silicon wafer formed in accordance with the present invention being electrochemically etched wherein holes injected into the n-type region from the p-type region are recombined.
Figure 6:
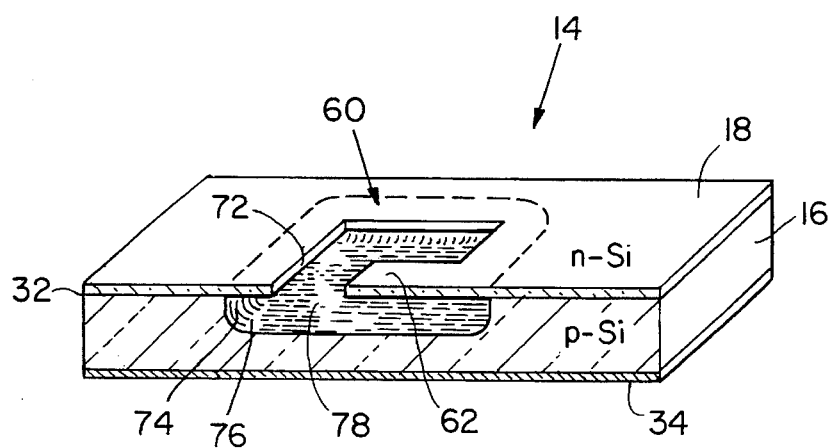
FIG. 6 is a perspective view of a cross-section of the wafer in FIG. 4A taken along lines 6—6 and etched in accordance with the present invention.

FIG. 5 depicts a portion of wafer 14 showing the recombination centers 80 formed within n-type region 18. During electrochemical etching, the recombination centers 80 prevent the holes "h" injected from p-type region 16 into the n-type region 18 from passing through n-type region 18 and reaching the surface 30. As a result, since most of the holes "h" do not reach the surface 30, the n-type region 18 does not etch. However, this does not affect the etching of the p-type region 16 which etches readily. FIG. 6 depicts a portion of wafer 14 after etching. It can be seen that the pattern 60 of the n-type region 18 does not etch. On the other hand, the p-type silicon is etched to form a cavity 78 within p-type region 16 which extends under the edges 72 of the n-type region 18 as well as under cantilever beam 62. The walls 74 of etched cavity 78 extend past the edges 72 of pattern 60 forming an undercut region 76.

Figure 7:
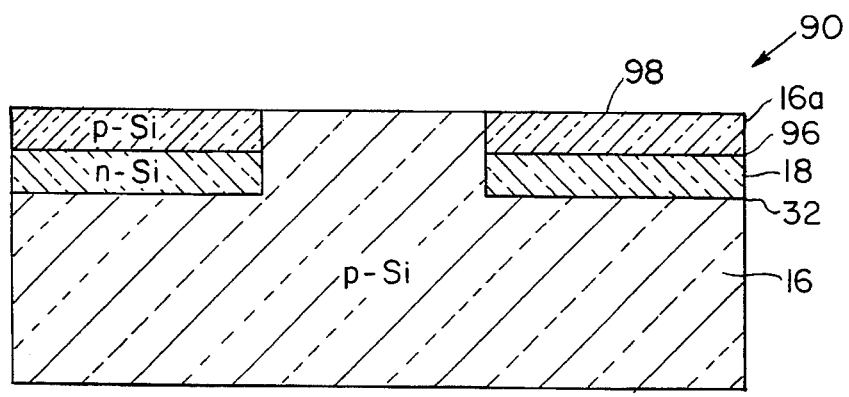
FIG. 7 is a cross-sectional view of another preferred silicon wafer prepared in accordance with the present invention for electrochemical etching.
Figure 8:
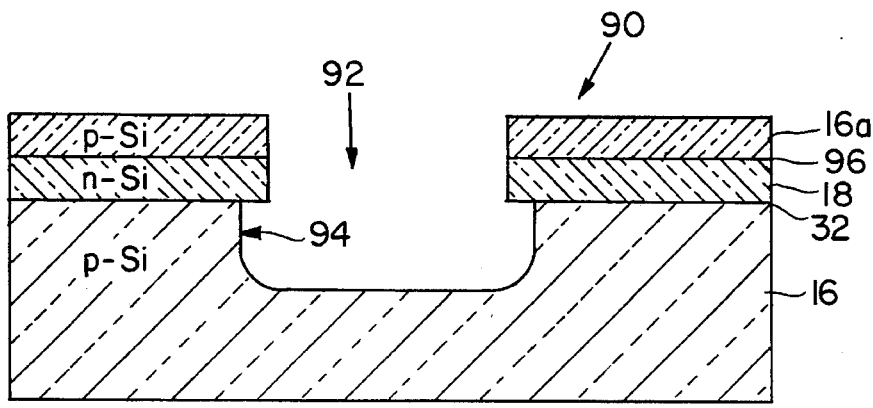
FIG. 8 is the cross-sectional view of the silicon wafer of FIG. 7 after etching.

Referring to FIG. 7, wafer 90 is another preferred silicon wafer which can be substituted for wafer 14. Wafer 90 differs from wafer 14 in that the n-type region 18 does not need recombination centers and is covered with a p-type layer 16a to form a p-n-p structure. N-type region 18 is formed by any of the methods previously discussed except that recombination centers do not need to be formed. The injection of holes through the n-type layer 18 is inhibited by the addition of the extra p-type layer 16a. The p-type layer 16a protects the n-type region 18 so that the n-type region 18 does not etch. The p-type layer 16a also does not etch. This is due to the fact that most of the voltage drop is across p-n junction 96 instead of across interface 98 between the HF electrolyte 22 and p-type layer 16a. Consequently, there is an insufficient potential drop across the interface 98 between HF electrolyte 22 and p-type layer 16a so that the oxidation reaction does not occur at interface 98. As can be seen in FIG. 8, only the p-type region 16 etches forming cavity 92 and walls 94, leaving the p-type layer 16a and n-type region 18 virtually unetched.

Figure 9A:
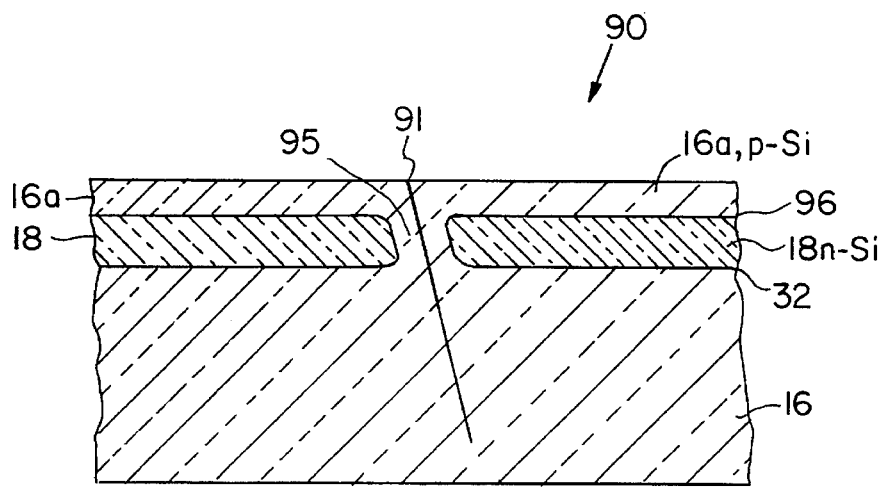
FIG. 9A is a cross-sectional view of a portion of a p-n-p silicon wafer having a micro,column of p-type silicon passing through an n-type region.
Figure 9B:
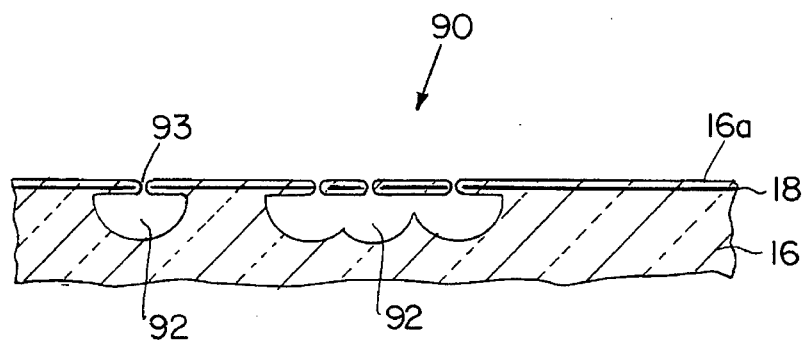
FIG. 9B is a cross-sectional view showing the etching of p-type silicon micro-columns.

Referring to FIG. 9A, enhanced dopant diffusion along dislocations or defects 91 of wafer 90 may be used to form p-type silicon micro-columns 95 through the n-type region 18. Acceptor dopants diffuse to the n-type region 18 and donor dopant diffuses away a small portion of the n-type region 18 which creates a p-type silicon breach or micro-column 95 in the n-type region 18. During electrochemical etching, the micro-columns 95 etch to form micro-holes 93 upon anodic biasing of the substrate (FIG. 9B). Such micro-holes 93 may serve to decrease the time required to under-etch large structures. Additionally, an area with a high density of micro-holes 93 can be used as a micro-sieve for filtering small particles (approximately 2 μm). The regions over which the micro-columns 95 are formed can be controlled by masking.

Figure 10:
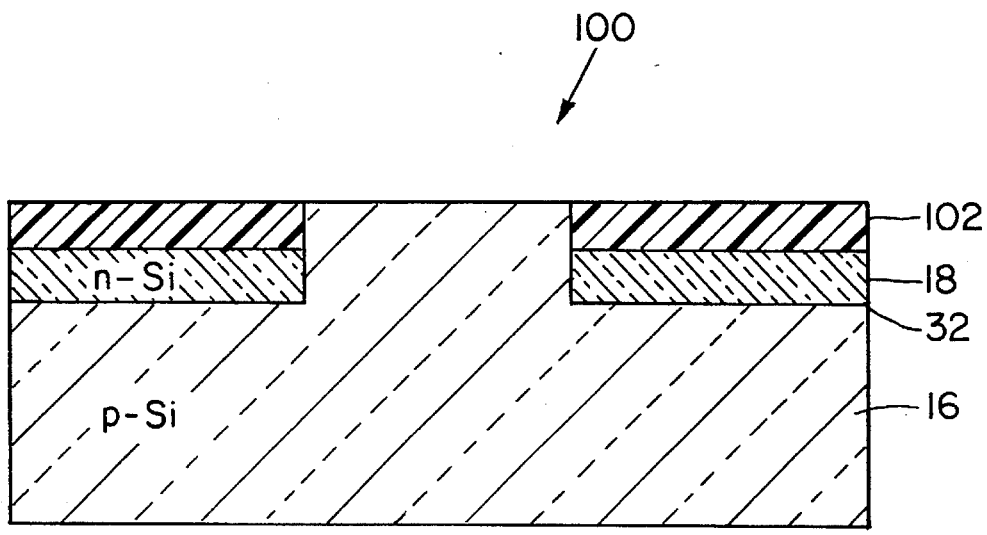
FIG. 10 is a cross-sectional View of still another preferred silicon wafer prepared in accordance with the present invention for electrochemical etching.
Figure 11:
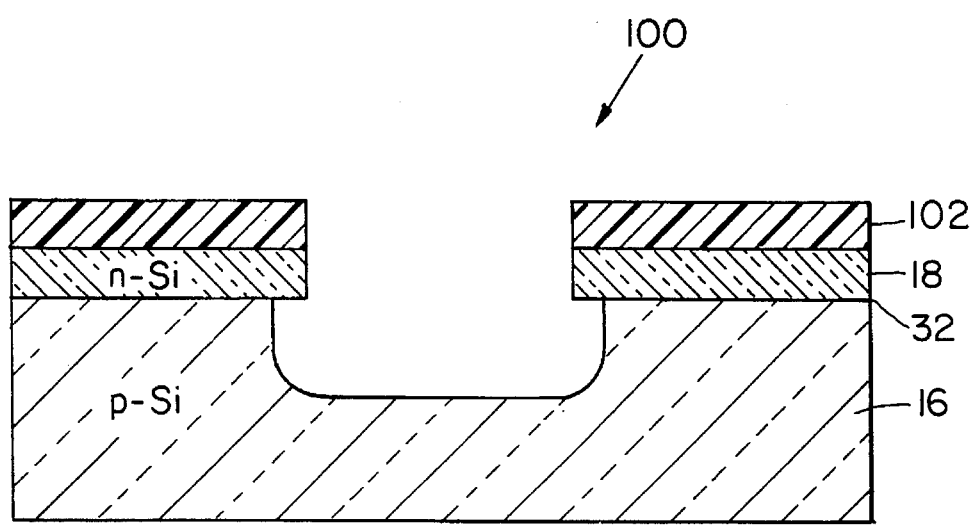
FIG. 11 is the cross-sectional view of the silicon wafer of FIG. 10 after etching.

Referring to FIG. 10, silicon wafer 100 is another preferred silicon wafer which can be substituted for wafer 14. Wafer 100 is similar to wafer 90 except that a layer of material 102 which is inert to HF electrolyte 22 covers the n-type region 18 instead of a p-type layer 16a. In the preferred embodiment, inert layer 102 is made from photoresist, polyimide, $S_{13}N_4$ and parylene, and is patterned to only cover the n-type region 18. Inert layer 102 does not chemically react with the HF electrolyte 22 and protects n-type region 18 from being etched by isolating the top surface of the n-type region 18 from the HF electrolyte 22. This prevents hole injection from defects within n-type region 18 to the n-type region electrolyte interface. Therefore, the instability caused by the etched through hole 56 usually formed by an anodic etching of n-type region on a p-type region is eliminated. As a result, as can be seen in FIG. 11, the p-type region 16 of wafer 100 becomes etched while layer 102 and n-type region 18 do not etch.

Figure 12:
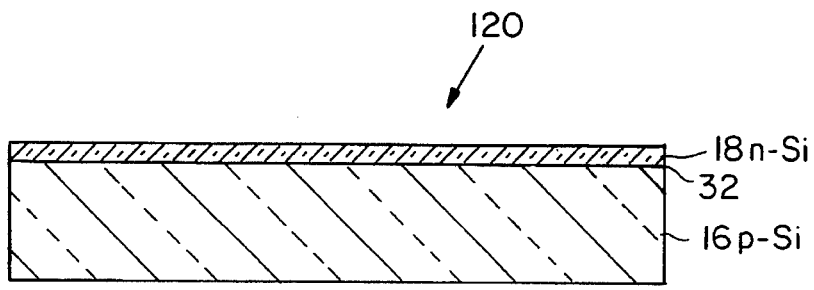
FIGS. 12 and 13 depict the process in which another preferred silicon wafer is prepared.
Figure 13:
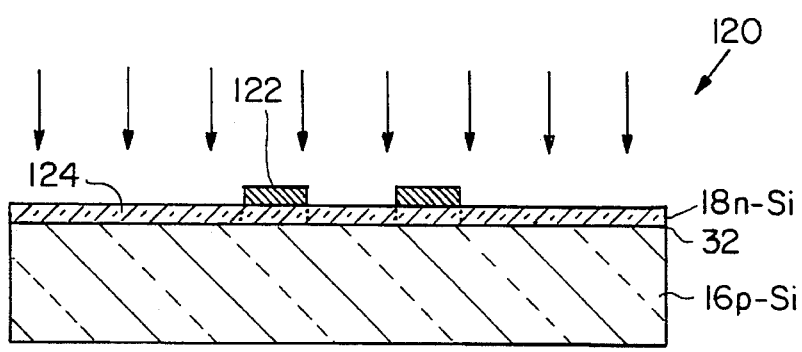
Figure 14:
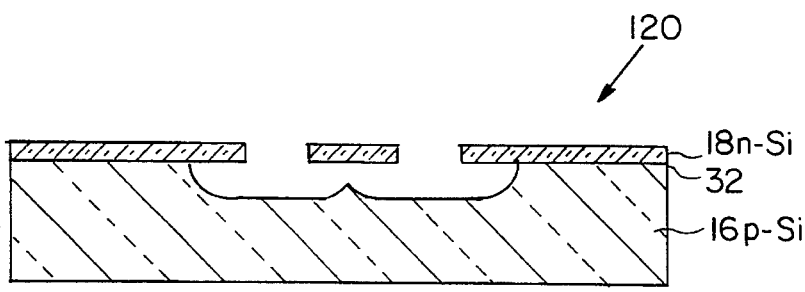
FIG. 14 depicts the wafer of FIGS. 12 and 13 after being etched.

FIGS. 12 and 13 depict another preferred silicon wafer 120 which can be substituted for silicon wafer 14. Silicon wafer 120 is made by forming an n,type region 18 over a p-type region 16. A mask 122 forming a desired pattern is then placed over the n-type region 18 as depicted in FIG. 13. The unmasked portions of n-type region 18 are then provided with recombination centers 124 by damaging the unmasked portions through implantation or by in-diffusing impurities into the n-type region 18 to create a patterned n-type region having recombination centers 124. The masked portions of n-type region 18 do not have recombination centers. The mask 122 is then removed through an etching process. Wafer 120 is then electrochemically etched in apparatus 10 to etch away the portions of the n-type region 18 that do not have recombination centers as well as p-type regions 16 while the portions of n-type region 18 having recombination centers do not etch as depicted in FIG. 14.

Figure 15:
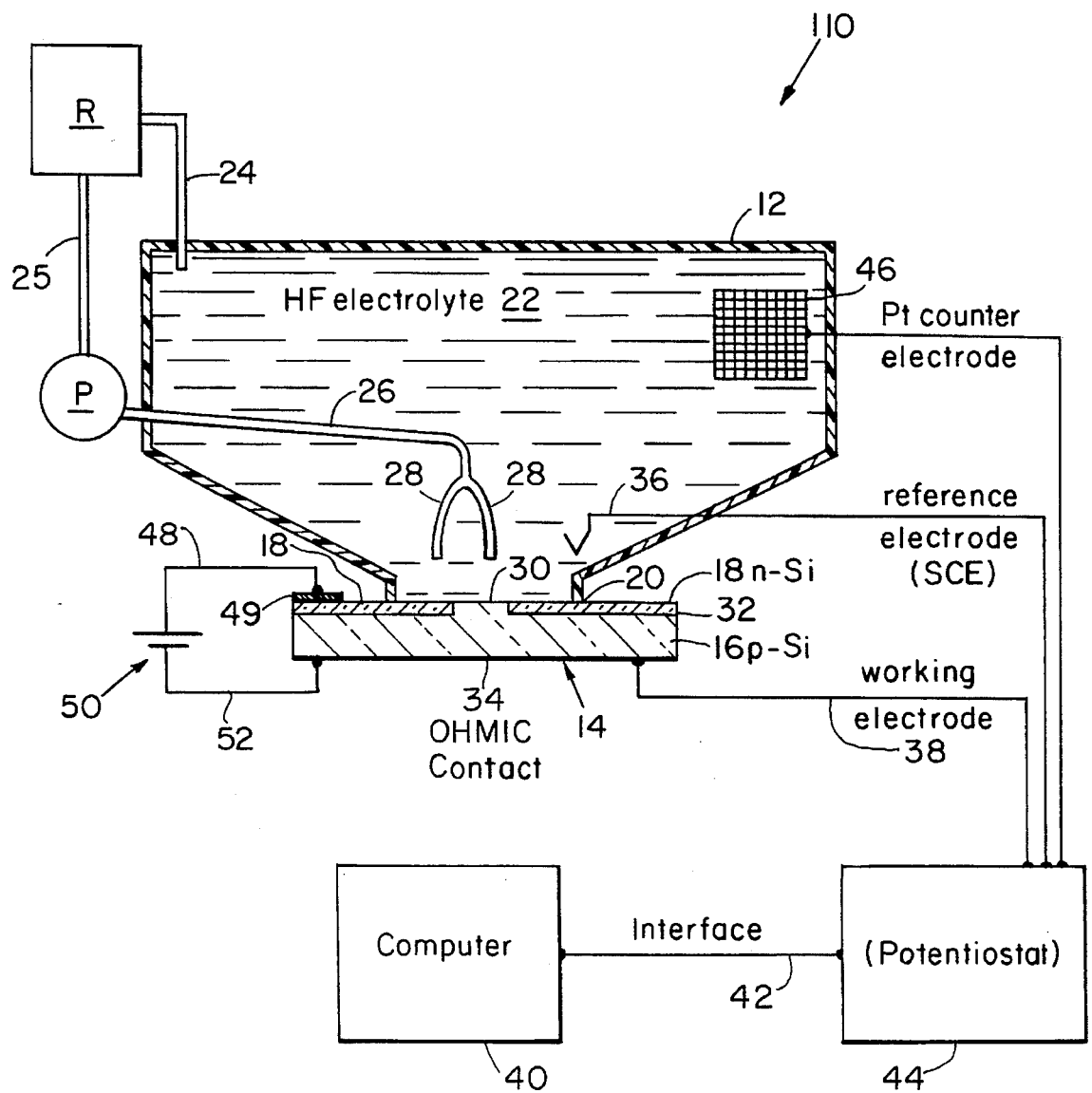
FIG. 15 is a top schematic view of another preferred electrochemical machining cell.

Referring to FIG. 15, apparatus 110 is similar to apparatus 10 except that a second power source 50 is used to control the voltage or bias between the n-type region 18 and the p-type region 16 across the p-n junction 32. Lead 52 electrically connects contact 34 on the p-type region 16 to power source 50. Lead 48 electrically connects contact 49 on the n-type region 18 to power source 50, thereby completing an electrical circuit through the p-n junction 32 and power source 50. Contact 49 is an ohmic contact formed for example by applying gallium on the n-type layer 18. Leads 48 and 52 are attached to contacts 49 and 34, for example, with epoxy. Power source 50 forces a reverse bias across the p-n junction 32 and eliminates hole injection into n-type region 18 from p-type region 16. As a result, etching of the n-type region 18 is prevented.

In addition to selectively etching p-type silicon, the electrochemical etching process of the present invention can be also used to selectively etch other semiconductor materials of long diffusion length such as germanium, silicon carbide and indirect bandgap III—V, or II—VI semiconductors using suitable electrolytes.

A variety of electrolytes can be used. For example, for silicon, germanium or silicon carbide one can use HF in water (aqueous) at various concentrations, $NH_4F$, $NH_4HF_2$, and other $F^-$ containing electrolytes.

Equivalents

While this invention has been particularly shown and described with references to preferred embodiments thereof, it will be understood by those skilled in the art that various changes and form and details may be made therein without departing from the spirit and scope of the invention as defined by the dependent claims. For example, the present invention is also applicable to more complex structures which may include more than a single p-n junction.

What is claimed is:

1. An electrochemical etching process comprising:

forming an n-type region on a p-type indirect band gap semiconductor substrate, a p-n junction separating the n-type region from the D-type substrate, at least portions of the n-type region being provided with means for inhibiting injection of holes from the p-type substrate through said portions of the n-type region; and exposing the n-type region and p-type substrate to an electrochemical etchant with an electrical bias supplied between the p-type substrate and etchant such that the p-type substrate is selectively etched with substantially no etching of said portions of the n-type region, the electrical bias forward biasing the p-n function.

2. A process as claimed in claim 1 wherein the means for inhibiting injection of holes comprises forming a p-type layer over the n-type region.

3. The process as claimed in claim 1 wherein the means for inhibiting injection of holes comprises recombination centers in said portions of the n-type region to induce recombination of holes injected into said portions of the n-type region.

4. The process as claimed in claim 3 wherein said portions of the n-type region are provided with impurities to induce the recombination.

5. The process as claimed in claim 3 wherein said portions of the n-type region are damaged to induce recombination.

6. The process as claimed in claim 3 wherein the n-type region is formed of amorphous silicon.

7. The process as claimed in claim 1 wherein the means for inhibiting injection of holes comprises forming a layer of material inert to the electrochemical etchant over the n-type region.

8. The process as claimed in claim 1 wherein the means for inhibiting injection of holes comprises imposing a reverse electrical bias between the p-type substrate and n-type region.

9. The process as claimed in claim 1 wherein the substrate is silicon.

10. The process as claimed in claim 1 wherein the electrochemical etchant is hydrofluoric acid electrolyte.

11. The process as claimed in claim 1 further comprising the step of circulating the electrochemical etchant past the semiconductor substrate.

12. An electrochemical etching process comprising:

forming an n-type region on a p-type semiconductor substrate, a p-n junction separating the n-type region from the p-type substrate;

forming a p-type layer over the n-type region to form a p-n-p structure; and exposing the p-n-p structure to an electrochemical etchant with an electrical bias supplied between the p-type substrate and etchant such that the p-type substrate is selectively etched with substantially no etching of the p-type layer and the n-type material, the electrical bias forward biasing said p-n junction.

13. The process as claimed in claim 12 wherein the substrate is silicon.

14. The process as claimed in claim 12 wherein the electrochemical etchant is hydrofluoric acid electrolyte.

15. An electrochemical etching process comprising:

forming an n-type region on a p-type semiconductor substrate, at least portions of the n-type region being provided impurities or defects for inducing recombination centers, the recombination centers for inducing recombination of holes injected from the p-type substrate into said portions of the n-type region; and exposing the n-type region and p-type substrate to an electrochemical etchant with an electrical bias applied between the p-type substrate and etchant such that the p-type substrate is selectively etched with substantially no etching of said portions of the n-type region.

16. The process as claimed in claim 15 wherein said portions of the n-type region are damaged to induce recombination.

17. The process as claimed in claim 15 wherein the substrate is silicon.

18. The process as claimed in claim 15 wherein the electrochemical etchant is hydrofluoric acid electrolyte.

19. An electrochemical etching process comprising:

forming an n-type region on a p-type semiconductor substrate, a p-n junction separating the n-type region from the p-type substrate;

forming a layer of material inert to electrochemical etchant over the n-type region, the layer of inert material inhibiting injection of holes from the p-type substrate through the n-type region; and exposing the layer of inert material and p-type substrate to an electrochemical etchant with an electrical bias supplied between the p-type substrate and etchant such that the p-type substrate is selectively etched with substantially no etching of the n-type region, the electrical bias forward biasing the p-n junction.

20. The process as claimed in claim 19 wherein the substrate is silicon.

21. The process as claimed in claim 19 wherein the electrochemical etchant is hydrofluoric acid electrolyte.

22. An electrochemical etching process comprising:

forming an n-type region on a p-type semiconductor substrate, a p-n junction separating the n-type region from the p-type substrate;

inhibiting the injection of holes from the p-type substrate through the n-type region by imposing a reverse electrical bias between the p-type substrate and n-type region; and exposing the n-type region and p-type substrate to an electrochemical etchant with an electrical bias supplied between the p-type substrate and etchant such that the p-type substrate is selectively etched with substantially no etching of the n-type region, the electrical bias between the p-type substrate and the etchant causing a forward bias across the p-n junction that is eliminated by the reverse electrical bias.

23. The process as claimed in claim 22 wherein the substrate is silicon.

24. The process as claimed in claim 22 wherein the electrochemical etchant is hydrofluoric acid electrolyte.

25. An electrochemical etching process comprising:

forming an n-type region on a p-type semiconductor substrate;

forming a region provided with impurities or defects for inducing recombination centers and a region without recombination centers within the n-type region, the recombination centers for inducing recombination of holes within the region of the n-type region having recombination centers; and exposing the n-type region and p-type substrate to an electrochemical etchant with an electrical bias applied between the p-type substrate and etchant such that the region without recombination centers is selectively etched with substantially no etching of the region of n-type region having recombination centers.

26. The process as claimed in claim 25 wherein the region having recombination centers is damaged to induce recombination.

27. The process as claimed in claim 25 wherein the substrate is silicon.

28. The process as claimed in claim 27 wherein the electrochemical etchant is hydrofluoric acid electrolyte.

29. An electrochemical etching process comprising:

forming an n-type region on a p-type semiconductor substrate, a p-n junction separating the n-type region from the p-type substrate, the n-type region having a hole diffusion length less than or equal to the thickness of then-type region, such that holes injected into the n-type region recombine within the n-type region; and exposing the n-type region and p-type substrate to an electrochemical etchant with an electrical bias supplied between the p-type substrate and etchant such that the p-type substrate is selectively etched with substantially no etching of said portions of the n-type region, the electrical bias forward biasing the p-n junction.

30. An electrochemical etching process comprising:

forming an n-type region on a p-type indirect band gap semiconductor substrate, at least portions of the n-type region being provided with means for inhibiting injection of holes from the p-type substrate through said portions of the n-type region, wherein the means for inhibiting injection of holes comprises recombination centers in said portions of the n-type region to induce recombination of holes injected into said portions of the n-type region; and exposing the n-type region and p-type substrate to an electrochemical etchant with an electrical bias supplied between the p-type substrate and etchant such that the p-type substrate is selectively etched with substantially no etching of said portions of the n-type region.

31. The process as claimed in claim 30 wherein said portions of the n-type region are provided with impurities to induce the recombination.

32. The process as claimed in claim 30 wherein said portions of the n-type region are damaged to induce recombination.

33. The process as claimed in claim 30 wherein the n-type region is formed of amorphous silicon.

* * * * *